US012477714B2

(12) United States Patent
Huang

(10) Patent No.: US 12,477,714 B2
(45) Date of Patent: Nov. 18, 2025

(54) METHOD FOR MANUFACTURING MEMORY DEVICE HAVING A PROTRUDING CHANNEL STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 726 days.

(21) Appl. No.: 17/741,837

(22) Filed: May 11, 2022

(65) Prior Publication Data

US 2023/0371232 A1 Nov. 16, 2023

(51) Int. Cl.
*H10B 12/00* (2023.01)

(52) U.S. Cl.
CPC .......... *H10B 12/09* (2023.02); *H10B 12/315* (2023.02); *H10B 12/34* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 9,449,830 B2 | 9/2016 | Kang | |
| 2012/0056263 A1 | 3/2012 | Lee et al. | |
| 2013/0334614 A1 | 12/2013 | Liaw | |
| 2016/0111428 A1* | 4/2016 | Kim | H10D 84/85 257/369 |
| 2019/0267088 A1* | 8/2019 | Jeon | H01L 23/5329 |
| 2020/0043931 A1 | 2/2020 | Sato et al. | |
| 2021/0305375 A1* | 9/2021 | Kim | H10D 30/6211 |
| 2021/0343731 A1* | 11/2021 | Chen | H10D 1/692 |

FOREIGN PATENT DOCUMENTS

| | | |
|---|---|---|
| TW | 201501307 A | 1/2015 |
| TW | I706517 B | 10/2020 |
| TW | 202215669 A | 4/2022 |

* cited by examiner

*Primary Examiner* — Michelle Mandala
(74) *Attorney, Agent, or Firm* — MUNCY, GEISSLER, OLDS & LOWE, P.C.

(57) ABSTRACT

A method for forming a memory device includes: forming an array of memory cells, wherein the memory cells respectively include an access transistor embedded in a semiconductor substrate and a storage capacitor over the semiconductor substrate and coupled to the access transistor; and forming a peripheral circuit around the memory cells, wherein the peripheral circuit includes a first transistor and a second transistor on the semiconductor substrate and each including a protruding channel structure and a gate structure covering the protruding channel structure, the protruding channel structure has a bottom part and an upper part, and the upper part of the protruding channel structure has a top width and a bottom width smaller than the top width.

20 Claims, 12 Drawing Sheets

METHOD FOR MANUFACTURING MEMORY DEVICE HAVING A PROTRUDING CHANNEL STRUCTURE

TECHNICAL FIELD

The present disclosure relates to a method for manufacturing a memory device having a protruding channel structure.

DISCUSSION OF THE BACKGROUND

Memory is fundamental in the operation of an electronic device. When combined with a central processing unit (CPU), an ability to run sets of instructions and store working data becomes possible. Random-access memory (RAM) is a well-known type of memory and is so-called because of its ability to access any address in memory with roughly the same time delay.

Dynamic random access memory, or DRAM, is a specific type of random access memory that allows for higher densities at a lower cost. In general, DRAM includes an array of memory cells, and includes a peripheral circuits disposed around the array of memory cells and configured for driving the memory cells. Transistors in the memory cells have undergone an intense evolution, now employing recessed channels to get adequate performance at the tiny size allowed them. However, the transistors in the peripheral circuits have stayed about the same through succeeding generations, until they have become the weak link in improving DRAM performance.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a memory device is provided. The memory device comprises: an array of memory cells, each comprising an access transistor and a storage capacitor coupled to the access transistor, wherein the access transistor comprises a trench gate structure buried in a semiconductor substrate; and a peripheral circuit, disposed around the memory cell, and comprising a three-dimensional transistor. The three-dimensional transistor is formed on the semiconductor substrate, and comprises a protruding channel structure and a gate structure covering the protruding channel structure, wherein the protruding channel structure has a bottom part and an upper part, and the upper part has a top width and a bottom width smaller the top width.

In another aspect of the present disclosure, a memory device is provided. The memory device comprises: an array of memory cells, each comprising an access transistor and a storage capacitor coupled to the access transistor, wherein the access transistor comprises a trench gate structure buried in a semiconductor substrate; and a peripheral circuit, disposed around the memory cells, and comprising a first transistor and a second transistor. The first transistor is formed on the semiconductor substrate, and comprises a first protruding channel structure having a first conductive type and a first gate structure covering the first protruding channel structure. The second transistor is formed on the semiconductor substrate, and comprises a second protruding channel structure having a second conductive type and a second gate structure covering the second protruding channel structure. The first and second gate structures respectively comprise a gate conductor and a gate dielectric layer lining along a bottom side of the gate conductor, and the second gate structure further comprise a work function layer extending in between the gate conductor and the gate dielectric layer.

In yet another aspect of the present disclosure, a method for forming a memory device is provided. The method comprises: forming an array of memory cells, wherein the memory cells respectively comprise an access transistor embedded in a semiconductor substrate and a storage capacitor over the semiconductor substrate and coupled to the access transistor; and forming a peripheral circuit around the memory cells, wherein the peripheral circuit comprises a first transistor and a second transistor formed on the semiconductor substrate and each comprising a protruding channel structure and a gate structure covering the protruding channel structure, the protruding channel structure has a bottom part and an upper part, and the upper part has a top width and a bottom width smaller the top width.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
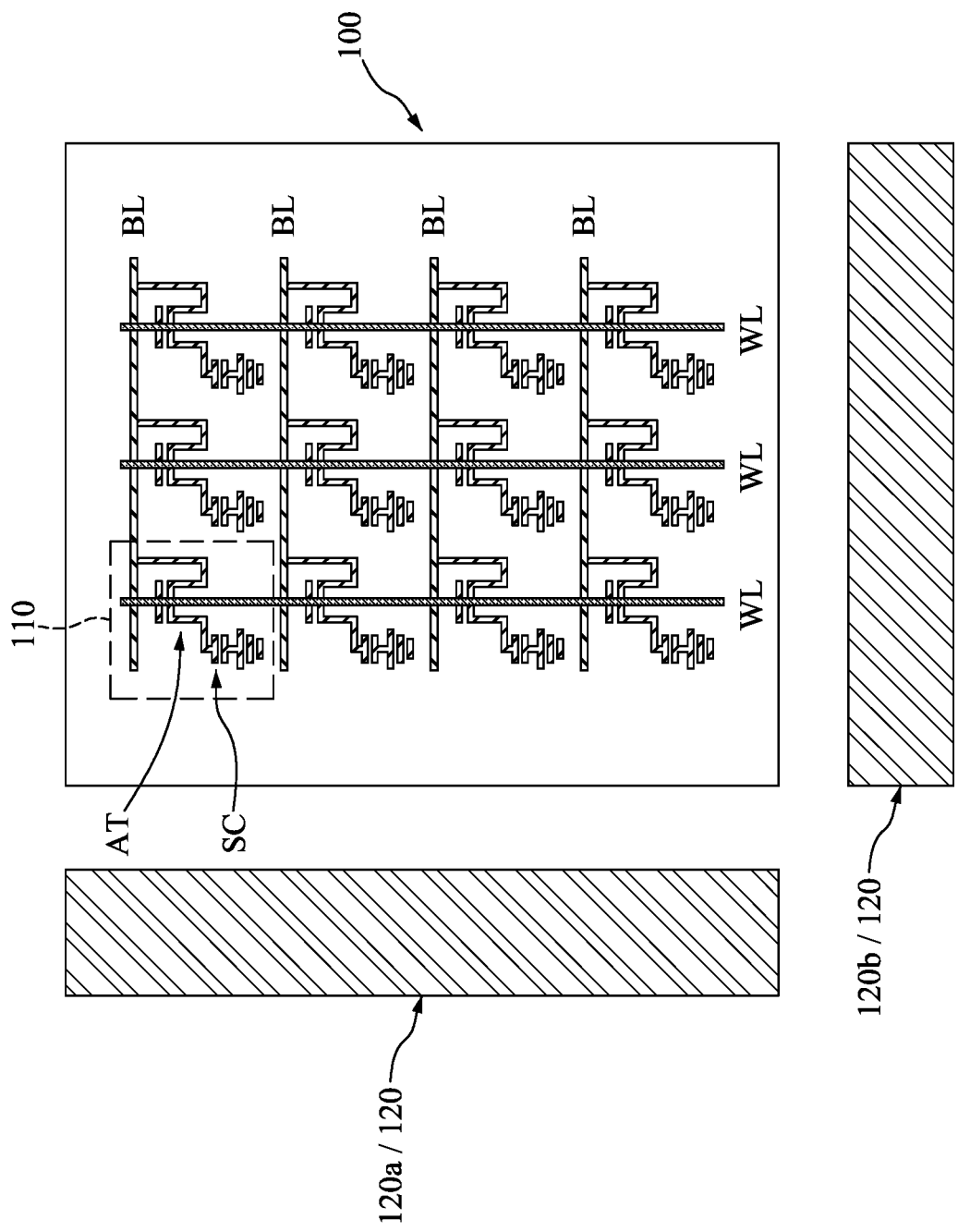
FIG. 1 is a schematic diagram illustrating a memory device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a memory device 10, according to some embodiments of the present disclosure.

Referring to FIG. 1, the memory device 10 includes a memory array 100. A plurality of memory cells 110 in the memory array 100 are arranged along columns and rows. In some embodiments, the memory device 10 is a dynamic random access memory (DRAM). In these embodiments, each memory cell 110 in the memory array 100 may include an access transistor AT and a storage capacitor SC. The access transistor AT may be a field effect transistor (FET). A terminal of the storage capacitor SC is coupled to a source/drain terminal of the access transistor AT, while the other terminal of the storage capacitor SC may be coupled to a voltage source (e.g., a ground voltage as depicted in FIG. 1). When the access transistor AT is turned on, the storage capacitor SC can be accessed. On the other hand, when the access transistor AT is in an off state, the storage capacitor SC is inaccessible.

During a write operation, the access transistor AT is turned on by asserting a word line WL coupled to a gate terminal of the access transistor AT, and a voltage applied on a bit line BL coupled to a source/drain terminal of the access transistor AT may be transferred to the storage capacitor SC coupled the other source/drain terminal of the access transistor AT. Accordingly, the storage capacitor SC may be charged or discharged, and a logic state "1" or a logic state "0" can be stored in the storage capacitor SC. During a read operation, the access transistor AT is turned on as well, and the bit line BL being pre-charged may be pulled up or pulled down according to a charge state of the storage capacitor SC. By comparing a voltage of the bit line BL with the pre-charge voltage, the charge state of the storage capacitor SC can be sensed, and the logic state of the memory cell 110 can be identified.

In addition to the memory array 100, the memory device 10 may further include peripheral circuits 120 disposed around the memory array 100 and configured for driving the memory cells 110 in the memory array 100. For instance (but not limited to), the memory device 10 may include peripheral circuits 120a, 120b disposed along two sides of the memory array 100. As will be further described, active devices including transistors (i.e., FETs) are disposed in the peripheral circuits 120 for performing various logic functions. Based on differences in terms of function and density, the access transistors AT in the memory array 100 and the transistors in the peripheral circuits 120 may be built differently.

Figure 2A:
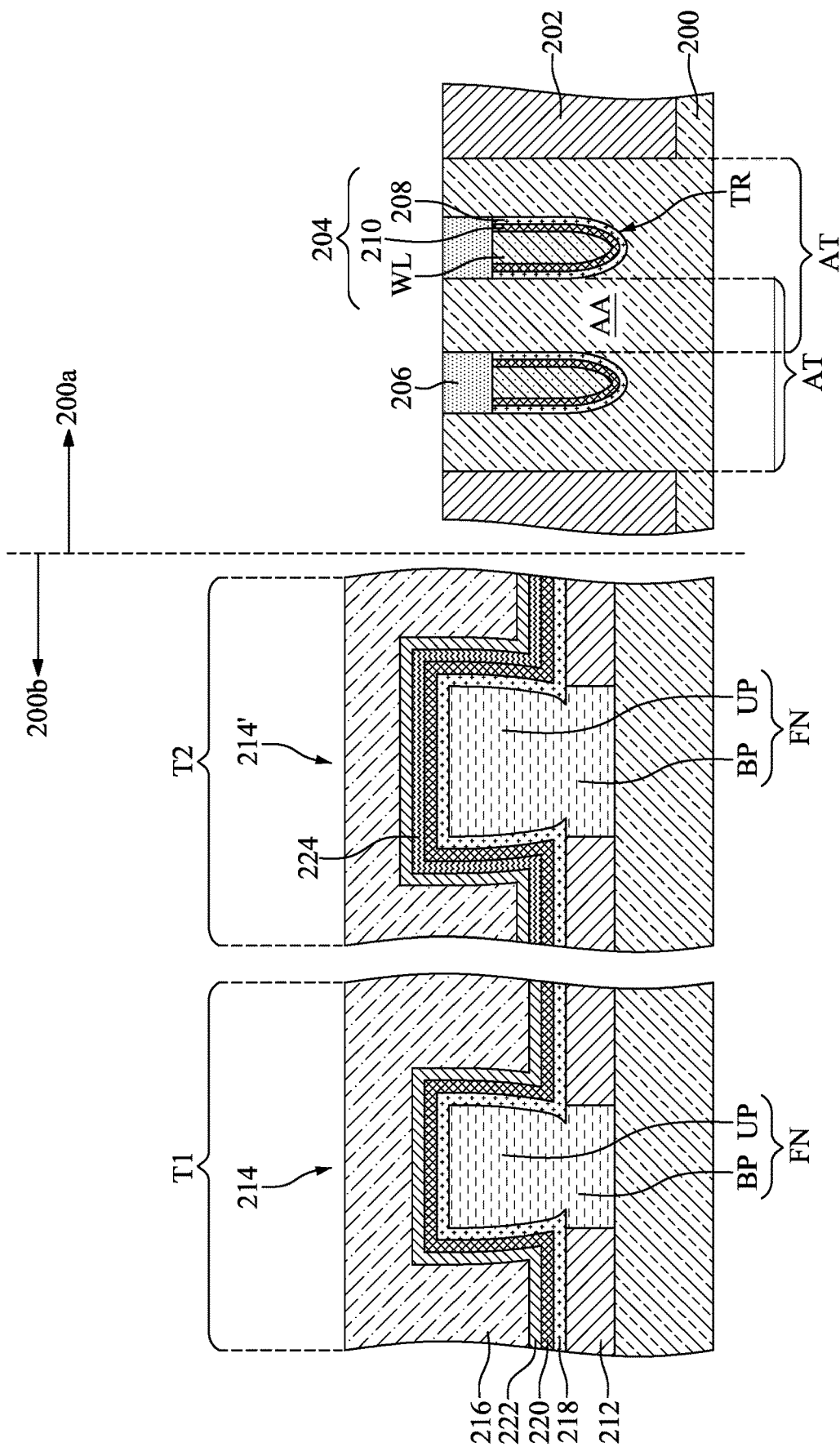
FIG. 2A is a schematic cross-sectional view illustrating some of access transistors in a memory array and some N-type and P-type transistors in peripheral circuits, according to some embodiments of the present disclosure.

FIG. 2A is a schematic cross-sectional view illustrating some of the access transistors AT in the memory array 100 and some transistors T1, T2 in the peripheral circuits 120, according to some embodiments of the present disclosure. It should be noted that, the access transistors AT and the transistors T1, T2 are each partially shown. In addition, the depicted cross-sectional view of the access transistors AT may not be coplanar with the depicted cross-sectional views of the transistors T1, T2.

Referring to FIG. 2A, the memory device 10 as described with reference to FIG. 1 is built on a semiconductor substrate 200. As examples, the semiconductor substrate 200 may be a semiconductor wafer or a semiconductor-on-insulator (SOI) wafer.

A first region 200a of the semiconductor substrate 200 may be subjected to a series of processes for forming the memory array 100 as described with reference to FIG. 1. During the processes, an isolation structure 202 is formed into the semiconductor substrate 200 from a top surface of the semiconductor substrate 200. Surface portions of the semiconductor substrate 200 within the first region 200a, which are functioned as active areas AA of the memory cells 110 (only a single one is shown), are laterally separated from one another by the isolation structure 202. In some embodiments, prior to formation of the isolation structure 202, the first region 200a of the semiconductor substrate 200 is doped with N-type, such that the access transistors AT to be formed therein are N-type FETs.

In some embodiments, two of the access transistors AT are formed within each active area AA. In these embodiments, each active area AA may be intersected with two gate structures 204 including gate terminals of the access transistors AT. The gate structures 204 are embedded in the active areas AA of the semiconductor substrate 200, and thus are also referred to as buried gate structures or trench gate structures. Trenches TR recessed from top surfaces of the active areas AA may be formed to accommodate the gate structures 204. In some embodiments, the gate structures 204 are filled in the trenches TR to a height lower than the top surfaces of the active areas AA. In these embodiments, insulating plugs 206 are disposed on the gate structures 204, to fill up the trenches TR.

Each gate structure 204 includes one of the word lines WL as described with reference to FIG. 1. The word lines WL are formed of a conductive material, such as tungsten or ruthenium. In addition, each gate structure 204 further includes a gate dielectric layer 208 wrapping around the word line WL and separating the word line WL from the surrounding active region AA. As an example, the gate dielectric layer 208 may be a high-k dielectric layer. According to some embodiments, each gate structure 204 further includes a barrier layer 210 lining between the word line WL and the gate dielectric layer 208. The barrier layer 210 is formed of a conductive material such as titanium nitride, or includes a stack of sub-layers including a titanium layer and a titanium nitride layer.

In some embodiments, a top surface of the word line WL is substantially coplanar with a topmost end of the gate dielectric layer 208, and the top surface of the word line WL as well as the topmost end of the gate dielectric layer 208 may be in contact with the overlying insulating plug 206. In those embodiments where each gate structure 204 further includes the barrier layer 210, the top surface of the word line WL may also be substantially coplanar with a topmost end of the barrier layer 210, and the topmost end of the barrier layer 210 may be in contact with the overlying insulating plug 206 as well.

When a word line WL is asserted, charges may be induced in the active region AA across the surrounding gate dielectric layer 208, and a conduction channel may be formed along the accommodating trench TR. Although not shown, a pair of source/drain regions may be formed at opposite sides of each gate structure 204, and the conduction channel formed along the gate structure 204 may be bounded at the pair of source/drain regions. As described with reference to FIG. 1, one of the source/drain regions may be routed to a bit line BL, while the other may be connected to a storage capacitor SC. In those embodiments where each active area AA is formed with two access transistors AT, the two access transistors AT in each active area AA may share a common source/drain region formed between the gate structures 204 of these two access transistors AT.

Although not shown, the bit lines BL and the storage capacitors SC may be embedded in an interconnection structure disposed on the semiconductor substrate 200. In certain embodiments, the bit lines BL may be deployed below the storage capacitors SC.

On the other hand, a second region 200b of the semiconductor substrate 200 may be subjected to a series of processes for forming the peripheral circuits 120 as described with reference to FIG. 1. In order to perform various logic operations, the peripheral circuits 120 includes both of N-type FETs and P-type FETs. The transistor T1 is one of the N-type FETs, and the transistor T2 is one of the P-type FETs.

Portions of the second region 200b of the semiconductor substrate 200 for forming the transistors T1 may be doped with P-type. In addition, according to some embodiments, these portions of the second region 200b of the semiconductor substrate 200 may be shaped to form parallel protruding channel structures FN (only a single one is shown), each functioned as a channel structure for one or more of the transistors T1. In these embodiments, an isolation structure 212 may be formed around the protruding channel structures FN, in order to isolate the protruding channel structures FN from one another. As will be described in greater details, each protruding channel structure FN may have a bottom part BP laterally surrounded by the isolation structure 212, and an upper part UP protruded from the isolation structure 212.

A gate structure 214 may intersect with one or more of the protruding channel structures FN, such that a top surface and opposite sidewalls of the upper part UP of each protruding channel structure FN are covered by the intersecting gate structure 214. In addition, the isolation structure 212 extending along the protruding channel structures FN may be partially overlapped with and covered by a plurality of the gate structures 214. Each gate structure 214 may include a gate conductor 216 and a gate dielectric layer 218 lining along a bottom side of the gate conductor 216. The gate conductor 216 can be capacitively coupled to the covered protruding channel structure FN across the gate dielectric layer 218 in between. The gate conductor 216 is formed of a conductive material, such as tungsten or ruthenium. In addition, as an example, the gate dielectric layer 218 may be a high-k dielectric layer.

In some embodiments, the gate conductor 216 in each gate structure 214 is formed as a conductive line intersecting the covered protruding channel structure FN. A pair of source/drain structures (not shown in this cross-sectional view) may be disposed at opposite sides of each gate structure 214, and in lateral contact with the protruding channel structure FN in between. When the gate conductor 216 of a gate structure 214 (which is functioned as a gate terminal of a transistor T1) is asserted, a conduction channel may be established along the covered protruding channel structure FN, and bounded at the pair of source/drain structures at opposite sides of the gate structure 214.

In some embodiments, each gate structure 214 further includes a first barrier layer 220 lining along the bottom side of the gate conductor 216, and located between the gate conductor 216 and the gate dielectric layer 218. The first barrier layer 220 is formed of a single conductive layer such as a titanium nitride layer, or includes a stack of conductive layers including a titanium layer and a titanium nitride layer.

In some embodiments, each gate structure 214 further includes a second barrier layer 222 lining along the bottom side of the gate conductor 216, and extending between the first barrier layer 220 and the gate conductor 216. The second barrier layer 222 is also formed of a conductive material, or includes a stack of conductive layer. In some embodiments, the second barrier layer 222 is formed of a single tantalum nitride layer. In alternative embodiments, the second barrier layer 222 includes a stack of conductive layers including a tantalum layer and a tantalum nitride layer.

Figure 2B:
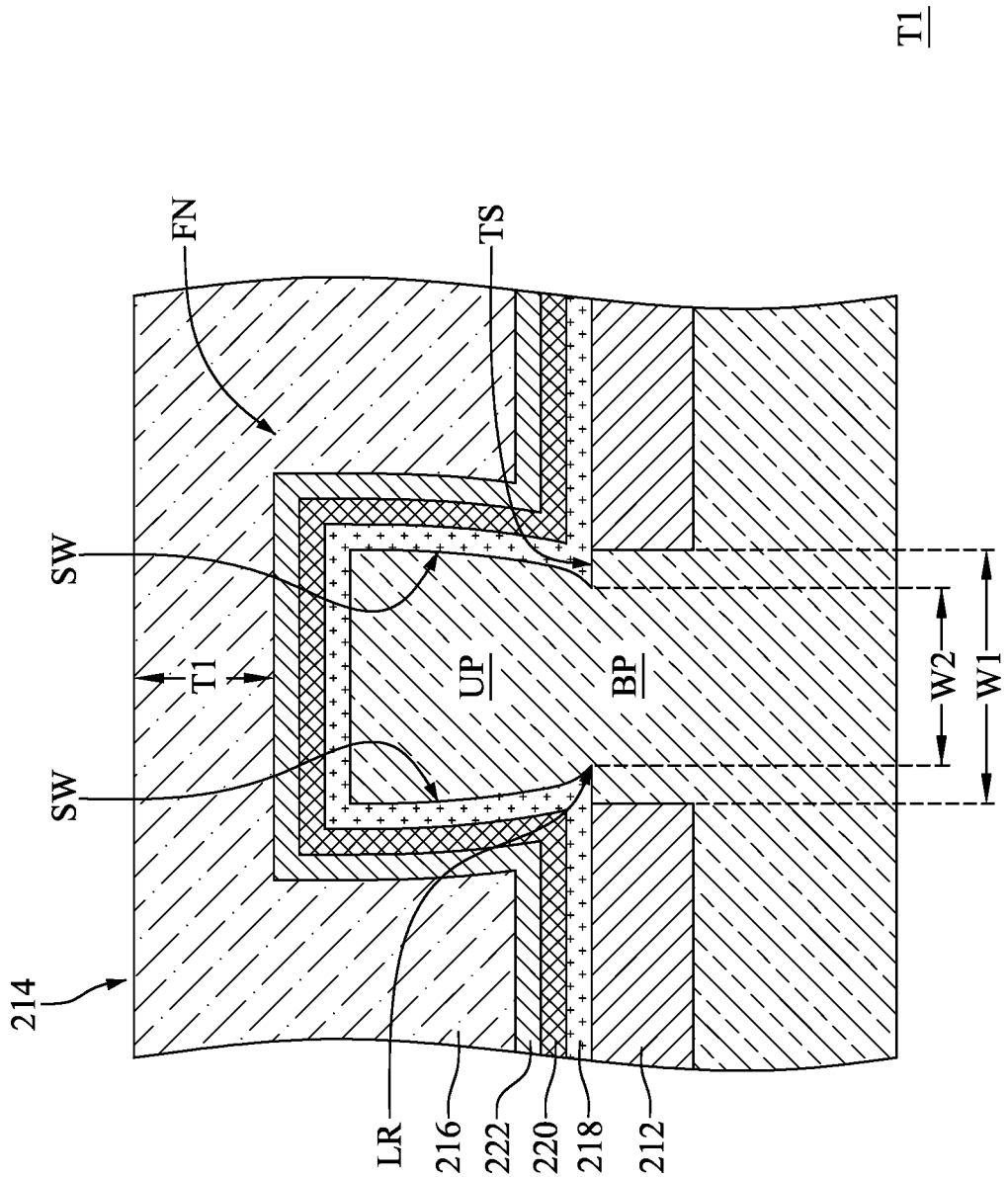
FIG. 2B is an enlarged cross-sectional view illustrating the N-type transistor as shown in FIG. 2A.

FIG. 2B is an enlarged cross-sectional view illustrating the transistor T1 as shown in FIG. 2A.

As described above, the protruding channel structure FN has the bottom part BP laterally surrounded by the isolation structure 212, and has the upper part UP covered by the gate structure 214. As shown in FIG. 2B, a top width W1 of the upper part UP may be greater than a bottom width W2 of the upper part UP. Further, in some embodiments, the upper part UP may taper from a top end of the upper part UP toward the bottom end of the upper part UP. In addition, sidewalls SW of the upper part UP may extend inwardly from top corners of the upper part UP to the bottom end of the upper part UP. According to some embodiments, the sidewalls SW are slant planes. In alternative embodiments, the sidewalls SW are curved planes.

On the other hand, the bottom part BP of the protruding channel structure FN may not taper downwardly. Instead, a width W3 at a top end of the bottom part BP (which is in contact with the bottom end of the upper part UP) may be substantially identical with a width W4 at a bottom end of the bottom part BP, or slightly smaller the width W4. Further, the widths W3, W4 of the bottom part BP may be greater than the width W2 at the bottom end of the upper part UP. In other words, edge regions of the bottom part BP may not in contact with the upper part UP, and lateral recesses LR may be defined at the bottom end of the upper part UP by the sidewalls SW of the upper part UP and top surfaces TS of the edge regions of the bottom part BP. In some embodiments, the widths W3, W4 are substantially equal to the width W1 at the top end of the upper part UP. In alternative embodiments, the widths W3, W4 are slightly greater than the width W1.

The gate conductor 216 and the gate dielectric layer 218 may extend into the lateral recesses LR. In some embodiments, the gate dielectric layer 218 conformally extends along the top surfaces FS and the sidewalls SW defining the lateral recesses LR. In those embodiments where the gate structure 214 further includes at least one of the barrier layers 220, 222, the at least one of the barrier layers 220, 222 may also extend into the lateral recesses LR, and may conformally extend along the top surfaces TS and the sidewalls SW defining the lateral recesses LR.

As compared to a protruding channel structure similar to the protruding channel structure FN but without the lateral recesses RS, the protruding channel structure FN may have a greater area in contact with the gate structure 214. Accordingly, gate coupling area between the gate conductor 216 and the protruding channel structure FN can be increased. Further, the gate coupling area can be increased without increasing dimension of the protruding channel structure FN (e.g., the width W1 of the upper part UP of the protruding channel structure FN).

Figure 2C:
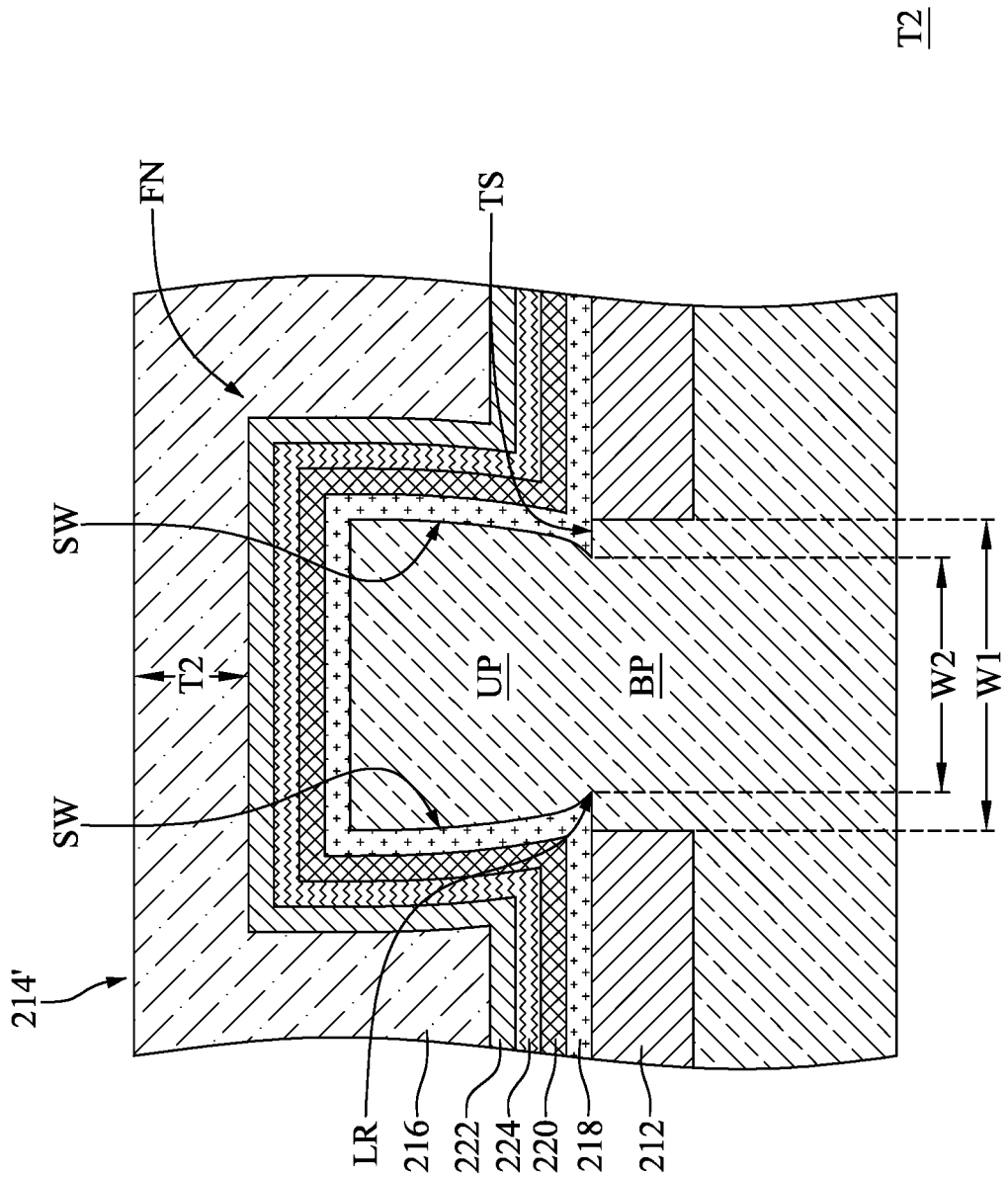
FIG. 2C is an enlarged cross-sectional view illustrating the P-type transistor as shown in FIG. 2A.

FIG. 2C is an enlarged cross-sectional view illustrating the transistor T2 as shown in FIG. 2A.

Referring to FIG. 2A and FIG. 2C, as similar to the transistor T1, the transistor T2 may also include a protruding channel structure FN formed by shaping a portion of the second region 200b of the semiconductor substrate 200, except that the protruding channel structure FN of the transistor T2 may be doped with N-type. As similar to the protruding channel structure FN of the transistor T1 described with reference to FIG. 2B, the protruding channel structure FN of the transistor T2 also has a bottom part BP and an upper part UP tapered toward a top end of the bottom part BP. In other words, the upper part UP of the protruding channel structure FN of the transistor T2 may have a top width (i.e., the width W1) and a bottom width (i.e., the width W2) smaller the top width, while the bottom part BP of the protruding channel structure FN of the transistor T2 may have top and bottom widths (i.e., the widths W3, W4) greater than the bottom width of the upper part UP, and substantially identical or greater than the top width of the upper part UP. In addition, the protruding channel structure FN of the transistor T2 may also have lateral recesses LR defined by top surfaces TS of the bottom part BP and sidewalls SW of the upper part UP. Other structural details of the protruding channel structure FN of the transistor T2 are identical with the protruding channel structure FN of the transistor T1, thus are not repeated again.

A gate structure 214' of the transistor T2 is similar to the gate structure 214 of the transistor T1, such that the gate structure 214' also includes a gate conductor 216 and a gate dielectric layer 218 lining along a bottom side of the gate conductor 216. In some embodiments, the gate structure 214' further includes one or both of barrier layers 220, 222 lining along the bottom side of the gate conductor 216 and located between the gate conductor 216 and the gate dielectric layer 218. As a difference from the gate structure 214 of the transistor T1, the gate structure 214' of the transistor T2 may further includes a work function layer 224 for further adjusting gate coupling between the gate conductor 216 and the covered protruding channel structure FN. The work function layer 224 lines along the bottom side of the gate conductor 216 and is located between the gate dielectric layer 218 and the gate conductor 216. In those embodiments where the gate structure 214' further includes the barrier layer 220, the barrier layer 220 may extend in between the work function layer 224 and the gate dielectric layer 218. In those embodiments where the gate structure 214' further includes the barrier layer 222, the barrier layer 222 may extend in between the work function layer 224 and the gate conductor 216. In addition, in those embodiments where the gate structure 214' includes both of the barrier layers 220, 222, the work function layer 224 may be sandwiched between the barrier layers 220, 222. As an example, the work function layer 224 may be formed of titanium carbide, tantalum carbide, titanium-tantalum carbide, the like or combinations thereof.

Although not shown, the gate conductor 216 in the gate structure 214' may be formed as a conductive line intersecting the covered protruding channel structure FN. A pair of source/drain structures (not shown in this cross-sectional view) may be disposed at opposite sides of the gate structure 214', and in lateral contact with the protruding channel structure FN in between. When the gate conductor 216 of a gate structure 214' (which is functioned as a gate terminal of the transistor T2) is asserted, a conduction channel may be established along the covered protruding channel structure FN, and bounded at the pair of source/drain structures at opposite sides of the gate structure 214'.

In some embodiments, a top surface of the gate conductor 214 of the transistor T1 is substantially leveled with a top surface of the gate structure 214' of the transistor T2. In these embodiments, a thickness T1 (shown in FIG. 2B) of the gate conductor 216 in the gate structure 214 may be greater than a thickness T2 (shown in FIG. 2C) of the gate conductor 216 in the gate structure 214'. In addition, a difference between the thickness T1 and the thickness T2 may be substantially equal to a thickness of the work function layer 224 in the gate structure 214'.

As similar to the transistor T1, the transistor T2 may have a greater gate coupling area without increasing dimension of the protruding channel structure FN, due to the tapered upper part UP of the protruding channel structure FN. As a result, the transistors T1, T2 can have improved performance, while still being formed with great density.

Figure 3:
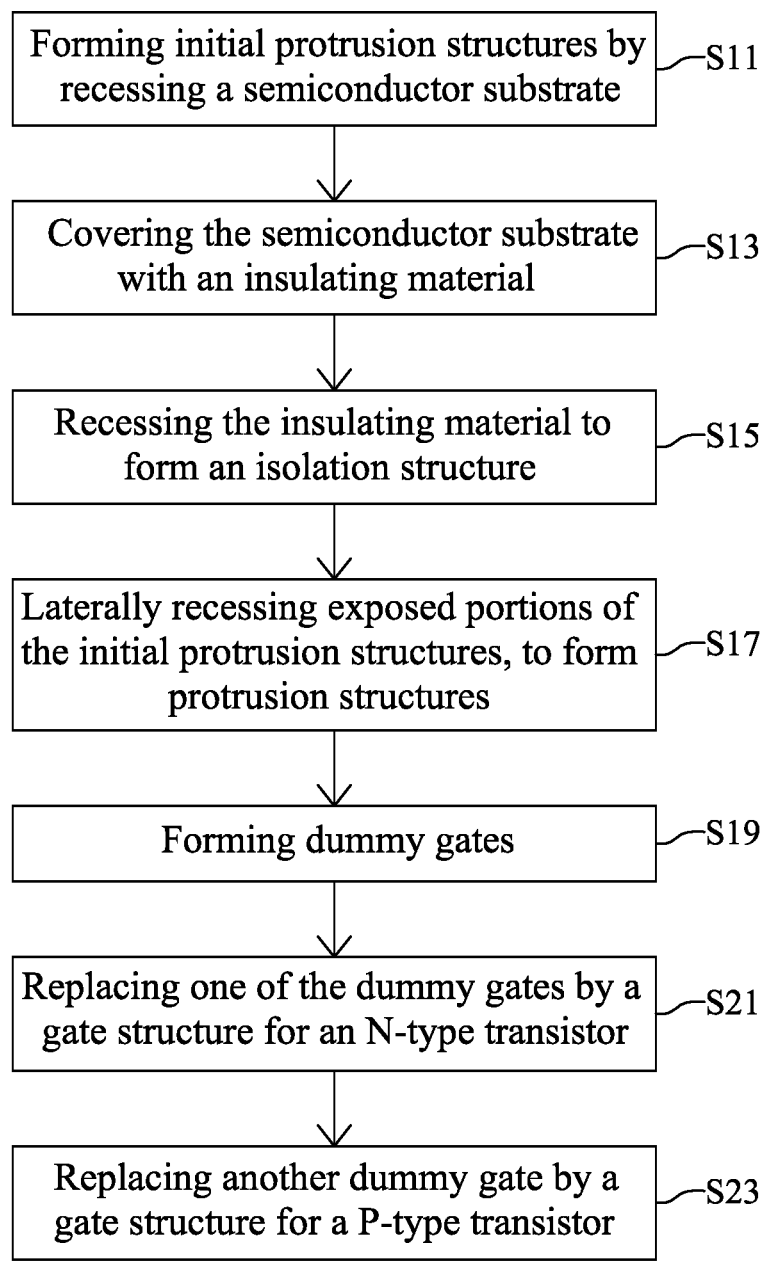
FIG. 3 is a flow diagram illustrating a process for manufacturing the N-type and P-type transistors as shown in FIG. 2A, according to some embodiments of the present disclosure.

FIG. 3 is a flow diagram illustrating a process for manufacturing the transistors T1, T2 as shown in FIG. 2A, according to some embodiments of the present disclosure. FIG. 4A through FIG. 4F are schematic cross-sectional views illustrating intermediate structures at various stages during the process as shown in FIG. 3.

Figure 4A:
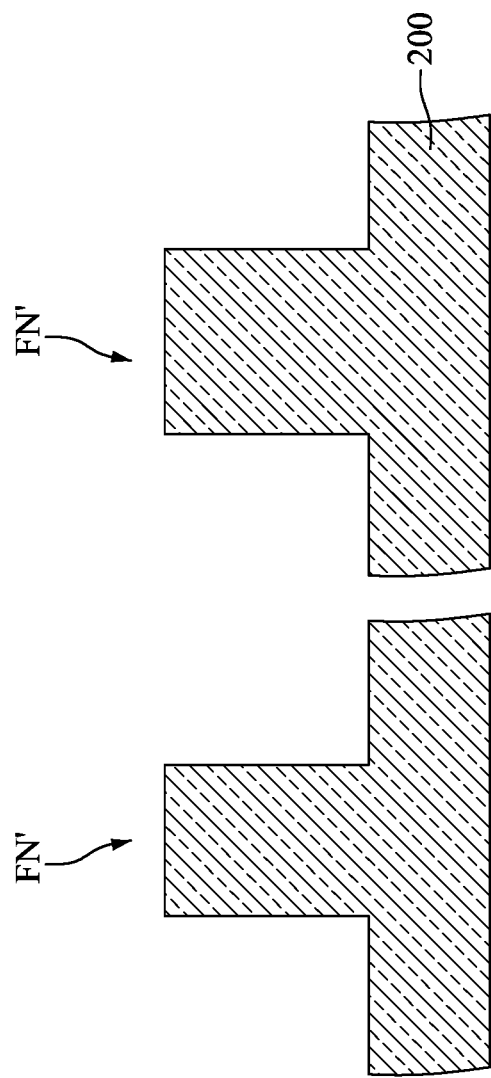
FIG. 4A through FIG. 4F are schematic cross-sectional views illustrating intermediate structures at various stages during the process as shown in FIG. 3.

Referring to FIG. 3 and FIG. 4A, step S11 is performed, and portions of the semiconductor substrate 200 are recessed from a top surface of the semiconductor substrate 200, to form initial protruding channel structures FN'. The initial protruding channel structures FN' will be further shaped to form the protruding channel structures FN of the transistors T1, T2. In some embodiments, a method for forming the initial protruding channel structures FN' includes a lithography process and at least one etching process. According to certain embodiments, a self-aligned multiple patterning (SAMP), such as a self-aligned double patterning (SADP), a self-aligned quadruple patterning (SAQP) or the like, is used for forming the initial protruding channel structures FN'. Further, in some embodiments, the initial protruding channel structures FN' are remained capped by hard masks (not shown) used during formation of the initial protruding channel structures FN'.

Figure 4B:
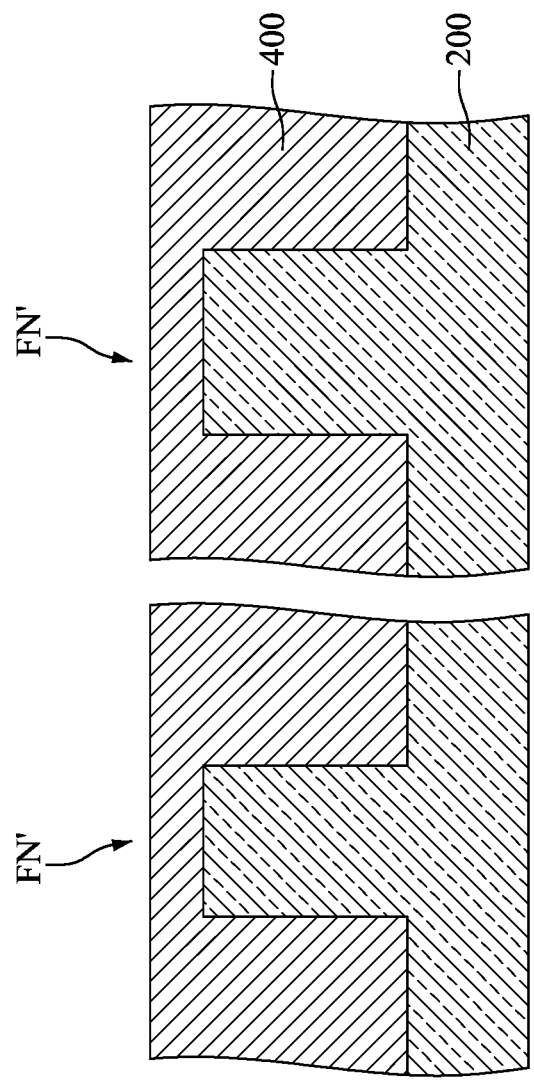

Referring to FIG. 3 and FIG. 4B, step S13 is performed, and the semiconductor substrate 200 is covered by an insulating material 400. The insulating material 400 will be further recessed to form the isolation structure 212 described with reference to FIG. 2A. Currently, trenches between the initial protruding channel structures FN' are filled by the insulating material 400. In some embodiments, the insulating material 400 is filled to a height over top surfaces of the initial protruding channel structures FN', and the top surfaces of the initial protruding channel structures FN' may be covered by the insulating material 400. A method for forming the insulating material 400 may include a deposition process, such as a chemical vapor deposition (CVD) process.

Figure 4C:
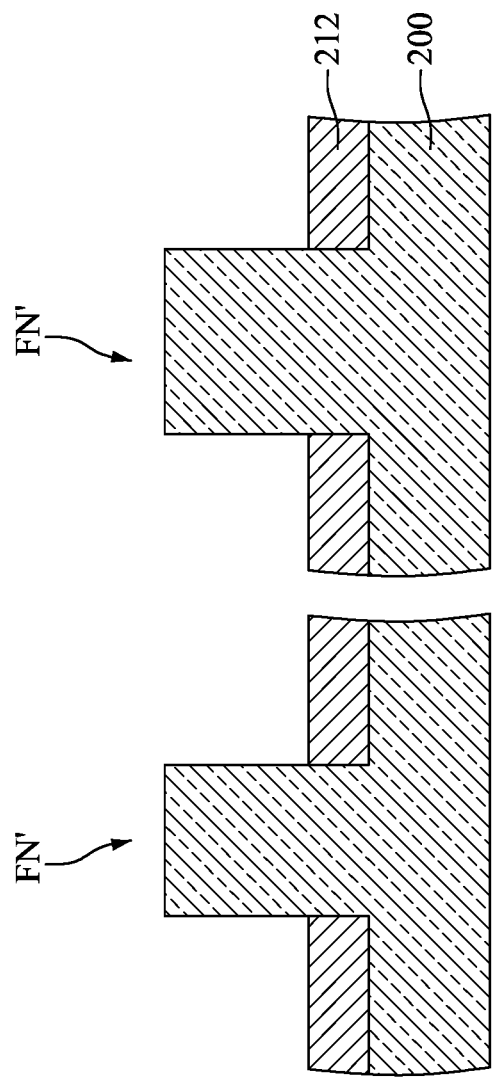

Referring to FIG. 3 and FIG. 4C, step S15 is performed, and the insulating material 400 is recessed to form the isolation structure 212. As a result, upper portions of the initial protruding channel structures FN' are exposed. In those embodiments where the as-formed initial protruding channel structures FN' are capped by the hard masks (not shown), these hard masks may be removed while recessing the insulating material 400. In some embodiments, an etching process may be used for recessing the insulating material 400.

Figure 4D:
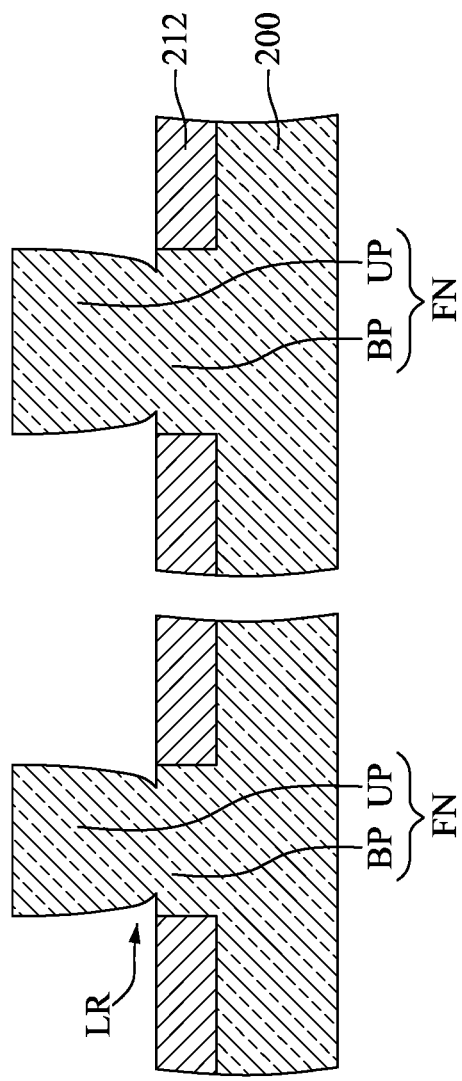

Referring to FIG. 3 and FIG. 4D, step S17 is performed, and the initial protruding channel structures FN' are shaped to form the protruding channel structures FN. In some embodiments, the protruding channel structures FN are formed by undercutting exposed portions of the initial protruding channel structures FN'. In other words, the upper portions of the initial protruding channel structures FN' protruded from the isolation structure 212 may be subjected to the undercutting, while bottom portions of the initial protruding channel structures FN' in lateral contact with the isolation structure 212 are protected from the undercutting. As a result of the undercutting, the lateral recesses LR are formed into the initial protruding channel structures FN', and the initial protruding channel structures FN' are shaped into the protruding channel structures FN. In some embodiments, an etching process (e.g., an isotropic etching process) is used for the undercutting. Further, according to some embodiments, additional hard masks (not shown) may be formed on the top surfaces of the initial protruding channel structures FN' before the undercutting, and may be removed after the undercutting.

Figure 4E:
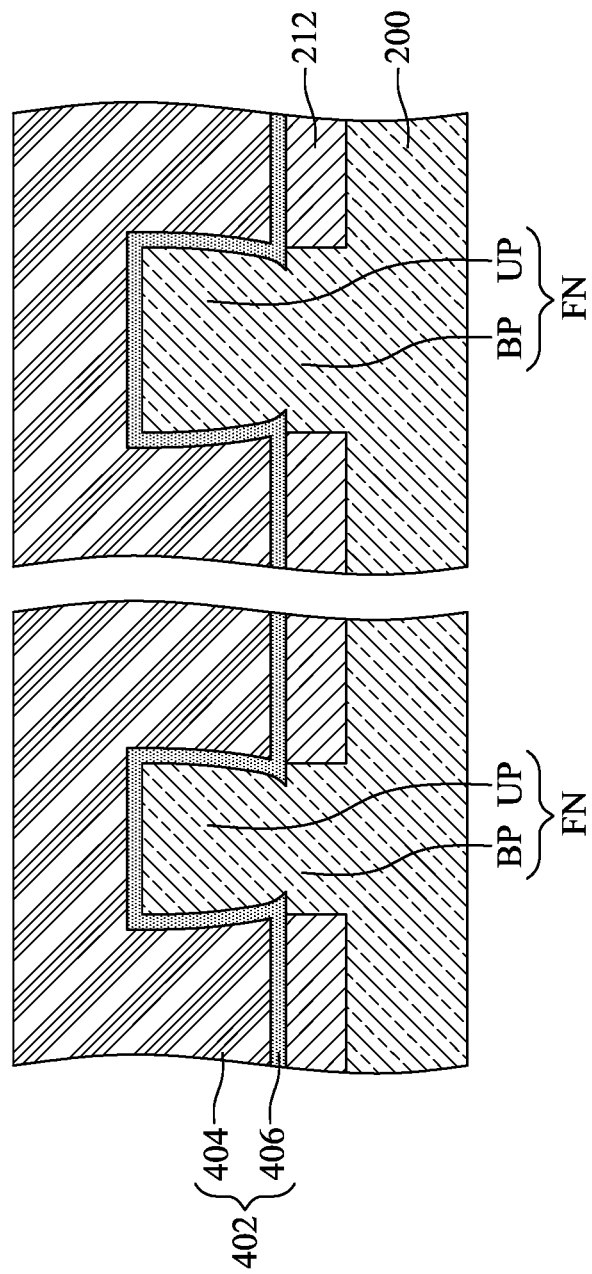

Referring to FIG. 3 and FIG. 4E, step S19 is performed, and dummy gates 402 are formed. In subsequent steps, the dummy gates 402 will be replaced by the gate structures 214, 214', respectively. According to some embodiments, the dummy gates 402 respectively include a sacrificial gate 404 and a sacrificial gate dielectric layer 406 lining along a bottom side of the sacrificial gate 404. As an example, the sacrificial gate dielectric layer 406 may be formed of silicon oxide, and the sacrificial gate 404 may be formed of polysilicon. In addition, a method for forming the dummy gates 402 may include forming a blanket sacrificial gate dielectric layer and a blanket sacrificial gate layer, and patterning the blanket layers to form the sacrificial gate dielectric layer 406 and the sacrificial gate 404 of the dummy gates 402, respectively. In some embodiments, the blanket sacrificial gate dielectric layer is formed by using a deposition process (e.g., a CVD process) or an oxidation process, and the blanket sacrificial gate layer is formed by performing a deposition process (e.g., a CVD process). Further, these blanket layers may be patterned by using a lithography process and at least one etching process.

Figure 4F:
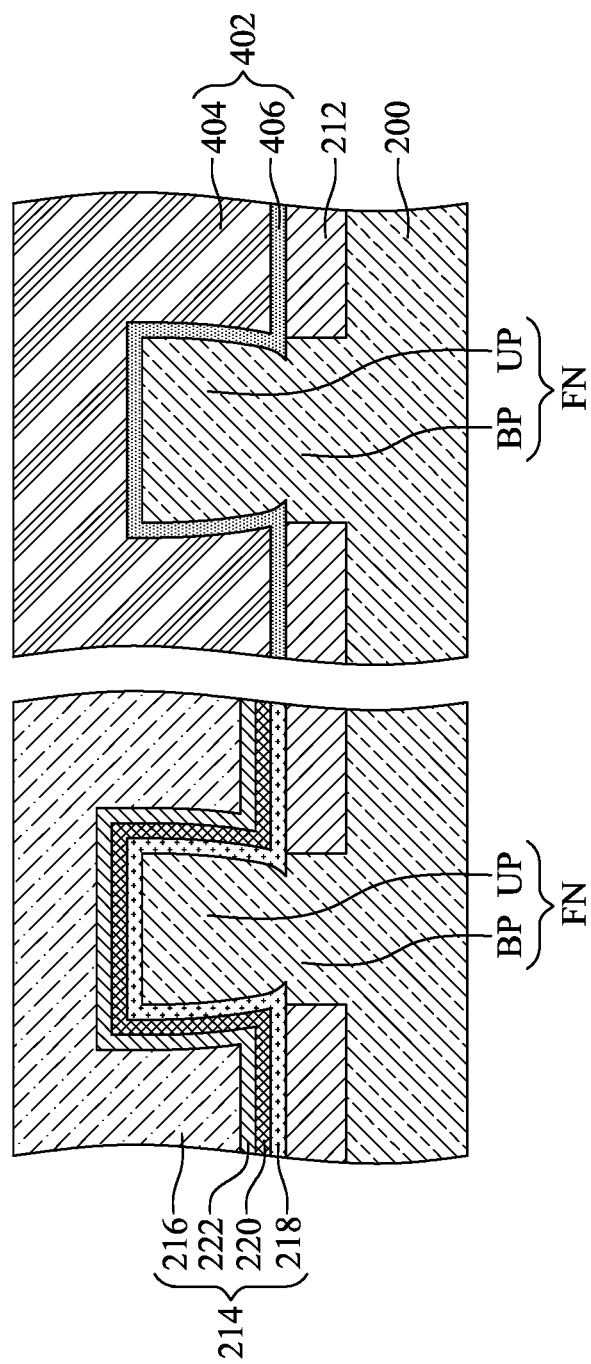

Referring to FIG. 3 and FIG. 4F, step S21 is performed, and one of the dummy gates 402 is replaced by the gate structure 214. In some embodiments, prior to the replacement, a dielectric layer (not shown) may be formed around the dummy gates 402. After formation of the dielectric layer, the dummy gate 402 to be replaced is removed, and the covered protruding channel structure FN is now exposed in an opening in the dielectric layer. Subsequently, the gate structure 214 is filled in the opening. Layers of the gate structure 214 may be respectively formed by a deposition process (e.g., a CVD process or an atomic layer deposition (ALD) process). A planarization process may be performed for removing excessive materials over the dielectric layer. Portions of the materials remained in the opening may form the gate structure 214. As an example, the planarization process may include a polishing process, an etching process or a combination thereof.

Referring to FIG. 3 and FIG. 2A, step S23 is performed, and another dummy gate 402 is replaced by the gate structure 214'. In some embodiments, this dummy gate 214' is removed, and an opening exposing covered protruding channel structure FN is formed in the pre-deposited dielectric layer (not shown). Subsequently, the gate structure 214' is filled in the opening by a series of deposition process and a possible planarization process, as similar to the method for forming the gate structure 214.

In some embodiments, the replacement for forming the gate structure 214 precedes the replacement for forming the gate structure 214'. In alternative embodiments, the replacement for forming the gate structure 214 follows the replacement for forming the gate structure 214'. In other embodiments, the dummy gates 402 to be replaced by the gate structures 214, 214' are removed at the same time. In these embodiments, same layers in the gate structures 214, 214' can be formed simultaneously. However, during formation of the work function layer 224 of the gate structure 214', layers that have been deposited for forming the gate structure 214 can be masked.

Furthermore, prior to these replacement steps, source/drain structures (not shown) may be formed at opposite sides of each dummy gate 402. According to some embodiments, formation of the source/drain structures may include recessing the protruding channel structures FN, and performing an epitaxial process.

In order to complete manufacturing of the peripheral circuits 120, contact plugs may be further formed on terminals of the transistors T1, T2, and interconnections may be formed over the contact plugs for routing the transistors T1, T2. In addition, the peripheral circuits 120 are formed around the memory cells 110 as described with reference to FIG. 1. The access transistors AT of the memory cells 110 may be formed before or after formation of the transistors T1, T2 in the peripheral circuits 120 during a front-end-of-line (FEOL) process. Further, the storage capacitors SC of the memory cells 110 may be formed along with the interconnections for routing the transistors T1, T2 during a back-end-of-line (BEOL) process.

Figure 5:
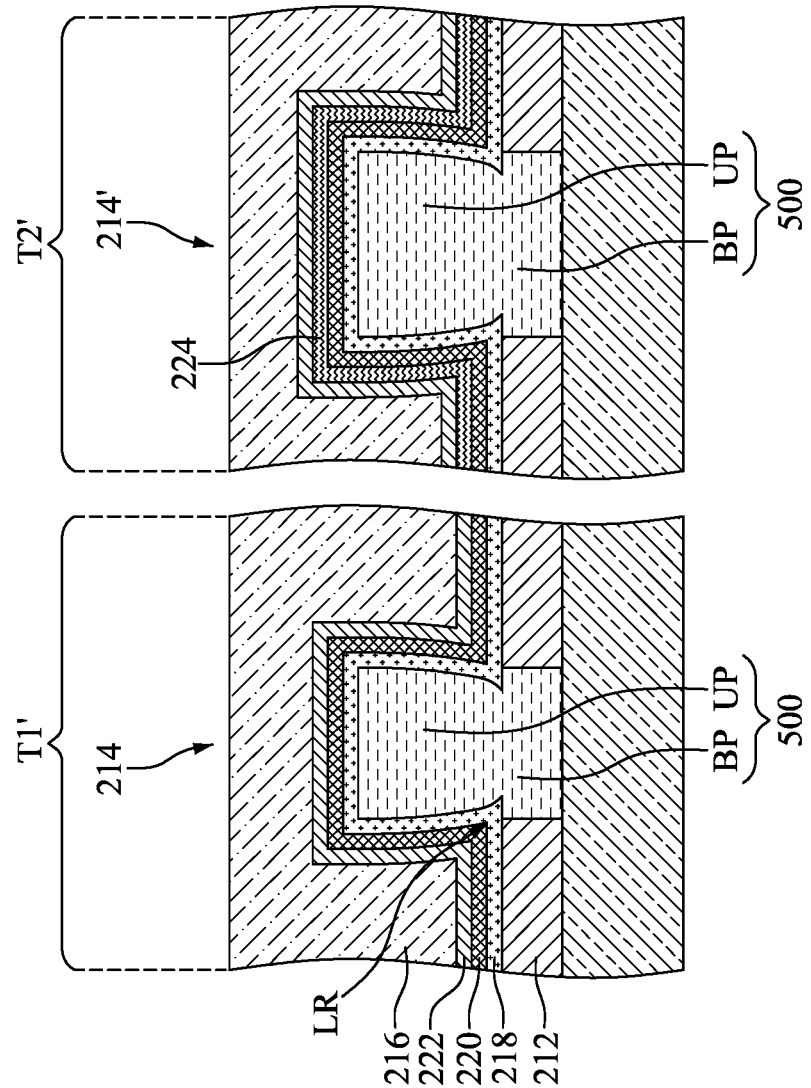
FIG. 5 is a schematic cross-sectional view illustrating transistors in peripheral circuits, according to some other embodiments of the present disclosure.

FIG. 5 is a schematic cross-sectional view illustrating transistors T1', T2' in the peripheral circuits 120, according to some other embodiments of the present disclosure.

The transistors T1', T2' are similar to the transistors T1, T2 as shown in FIG. 2A, except that protruding channel structures 500 as channels of the transistors T1', T2' are external to the semiconductor substrate 200. In other words, the protruding channel structures 500 are formed on the semiconductor substrate 200, rather than being formed by shaping the semiconductor substrate 200. In some embodiments, the protruding channel structures 500 are formed of a semiconductor material different from a semiconductor material of the semiconductor substrate 200.

Despite the difference in material, the protruding channel structures 500 are structurally similar to the protruding channel structures FN as shown in FIG. 2A. In other words, the protruding channel structures 500 each have a bottom part BP laterally surrounded by the isolation structure 212, and have an upper part UP protruded with respect to the isolation structure 212 and having lateral recesses LR at bottom. Accordingly, the upper part UP of the protruding channel structure 500 has a top width greater and a bottom width smaller the top width. On the other hand, the bottom part BP of the protruding channel structure 500 may be protected from the lateral recessing by the isolation structure 212. As a result, top and bottom widths of the bottom part BP of the protruding channel structure 500 are greater than the bottom width of the upper part UP of the protruding channel structure 500.

In regarding manufacturing of the transistors T1, T2, initial protruding channel structures are formed and patterned on the semiconductor substrate 200. Thereafter, a series of the steps S13 to S23 described with reference to FIG. 3, FIG. 4A through FIG. 4F and FIG. 2A are performed for shaping the initial protruding channel structures to form the protruding channel structures 500 and forming the gate structures 214, 214'.

As above, the present disclosure provides a memory device with a memory array and peripheral circuits around the memory array. The memory array utilizes trench-type transistors, while the peripheral circuits use three-dimensional transistors having protruding channels. These protruding channels each include a bottom part laterally surrounded by an isolation structure, and include an upper part protruded with respect to the isolation structure. Particularly, the upper part has a lateral recess at its bottom, thus has a bottom width smaller a top width. On the other hand, the bottom part may be protected from the lateral recessing by the isolation structure, and has top and bottom widths greater than the bottom width of the upper part. As having the lateral recess, the protruding channel can have a greater coupling area with an intersecting gate structure without increasing dimension of the protruding channel. Therefore, these three-dimensional transistors can have improved performance, while still being formed with great density. In some embodiments, as compared to a gate structure in an N-type three-dimensional transistor, a gate structure in a P-type three-dimensional transistor further includes a work function layer for further adjusting the gate coupling of the P-type three-dimensional transistor.

In an aspect of the present disclosure, a memory device is provided. The memory device comprises: an array of memory cells, each comprising an access transistor and a storage capacitor coupled to the access transistor, wherein the access transistor comprises a trench gate structure buried in a semiconductor substrate; and a peripheral circuit, disposed around the memory cell, and comprising a three-dimensional transistor. The three-dimensional transistor is formed on the semiconductor substrate, and comprises a protruding channel structure and a gate structure covering the protruding channel structure, wherein the protruding channel structure has a bottom part and an upper part, and the upper part has a top width and a bottom width smaller the top width.

In another aspect of the present disclosure, a memory device is provided. The memory device comprises: an array of memory cells, each comprising an access transistor and a storage capacitor coupled to the access transistor, wherein the access transistor comprises a trench gate structure buried in a semiconductor substrate; and a peripheral circuit, disposed around the memory cells, and comprising a first transistor and a second transistor. The first transistor is formed on the semiconductor substrate, and comprises a first protruding channel structure having a first conductive type and a first gate structure covering the first protruding channel structure. The second transistor is formed on the semiconductor substrate, and comprises a second protruding channel structure having a second conductive type and a second gate structure covering the second protruding channel structure. The first and second gate structures respectively comprise a gate conductor and a gate dielectric layer lining along a bottom side of the gate conductor, and the second gate structure further comprise a work function layer extending in between the gate conductor and the gate dielectric layer.

In yet another aspect of the present disclosure, a method for forming a memory device is provided. The method comprises: forming an array of memory cells, wherein the memory cells respectively comprise an access transistor embedded in a semiconductor substrate and a storage capacitor over the semiconductor substrate and coupled to the access transistor; and forming a peripheral circuit around the memory cells, wherein the peripheral circuit comprises a first transistor and a second transistor formed on the semiconductor substrate and each comprising a protruding channel structure and a gate structure covering the protruding channel structure, the protruding channel structure has a bottom part and an upper part, and the upper part has a top width and a bottom width smaller the top width.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for manufacturing a memory device, comprising:
    forming an array of memory cells, wherein the memory cells respectively comprise an access transistor embedded in a semiconductor substrate and a storage capacitor over the semiconductor substrate and coupled to the access transistor; and
    forming a peripheral circuit around the memory cells, wherein the peripheral circuit comprises a first transistor and a second transistor on the semiconductor substrate and each comprising a protruding channel structure and a gate structure covering the protruding channel structure, the protruding channel structure has a bottom part and an upper part, and the upper part of the protruding channel structure has a top width and a bottom width smaller than the top width, wherein a top width of the bottom part of the protruding channel structure is greater than the bottom width of the upper part of the protruding channel.

2. The method according to claim 1, wherein formation of each of the first and second transistor comprises:
    shaping a surface portion of the semiconductor substrate to form an initial protruding channel structure; and laterally recessing an upper part of the initial protruding channel structure to form the protruding channel structure.

3. The method according to claim 2, wherein formation of each of the first and second transistors further comprises:
forming an isolation structure laterally surrounding a bottom part of the initial protruding channel structure before laterally recessing the upper part of the initial protruding channel structure.

4. The method according to claim 2, wherein an isotropic etching process is used for laterally recessing the initial protruding channel structure.

5. The method according to claim 1, wherein formation of each of the first and second transistors comprises:
forming a dummy gate on the protruding channel structure; and
replacing the dummy gate with the gate structure.

6. The method according to claim 5, wherein the dummy gate comprises a polysilicon sacrificial gate and a sacrificial gate dielectric layer lining along a bottom side of the sacrificial gate.

7. The method according to claim 1, wherein the protruding channel structure of the second transistor is doped with N-type, and the gate structure comprises a gate conductor, a gate dielectric layer lining along a bottom side of the gate conductor and a work function layer extending in between the gate conductor and the gate dielectric layer.

8. The method according to claim 7, wherein the work function layer is absent in the first transistor.

9. The method according to claim 1, wherein the protruding channel structure is external to the semiconductor substrate.

10. The method according to claim 9, wherein formation of each of the first and second transistors comprises:
forming an initial protruding channel structure on the semiconductor substrate; and
laterally recessing an upper part of the initial protruding channel structure to form the protruding channel structure.

11. A method for manufacturing a memory device, comprising:
forming an array of memory cells, each comprising an access transistor and a storage capacitor coupled to the access transistor, wherein the access transistor comprises a trench gate structure buried in a semiconductor substrate; and
forming a peripheral circuit around the memory cells, and comprising: forming a three-dimensional transistor on the semiconductor substrate, and comprising a protruding channel structure and a gate structure covering the protruding channel structure, wherein the protruding channel structure has a bottom part and an upper part, and the upper part of the protruding channel structure has a top width and a bottom width smaller than the top width, wherein a top width of the bottom part of the protruding channel structure is greater than the bottom width of the upper part of the protruding channel.

12. The method according to claim 11, wherein formation of a three-dimensional transistor comprises:
shaping a surface portion of the semiconductor substrate to form an initial protruding channel structure; and
laterally recessing an upper part of the initial protruding channel structure to form the protruding channel structure.

13. The method according to claim 12, wherein formation of a three-dimensional transistor further comprises:
forming an isolation structure laterally surrounding a bottom part of the initial protruding channel structure before laterally recessing the upper part of the initial protruding channel structure.

14. The method according to claim 12, wherein an isotropic etching process is used for laterally recessing the initial protruding channel structure.

15. The method according to claim 11, wherein formation of a three-dimensional transistor comprises:
forming a dummy gate on the protruding channel structure; and
replacing the dummy gate with the gate structure.

16. The method according to claim 15, wherein the dummy gate comprises a polysilicon sacrificial gate and a sacrificial gate dielectric layer lining along a bottom side of the sacrificial gate.

17. The method according to claim 11, wherein the protruding channel structure of the second transistor is doped with N-type, and the gate structure comprises a gate conductor, a gate dielectric layer lining along a bottom side of the gate conductor and a work function layer extending in between the gate conductor and the gate dielectric layer.

18. The method according to claim 17, wherein the work function layer is absent in the first transistor.

19. The method according to claim 11, wherein the protruding channel structure is external to the semiconductor substrate.

20. The method according to claim 19, wherein formation of each of the first and second transistors comprises:
forming an initial protruding channel structure on the semiconductor substrate; and
laterally recessing an upper part of the initial protruding channel structure to form the protruding channel structure.

* * * * *